United States Patent
Snyder et al.

(10) Patent No.: US 8,564,605 B2
(45) Date of Patent: Oct. 22, 2013

(54) DISPLAY INTERFACE BUFFER

(75) Inventors: Warren Snyder, Snohomish, WA (US); John B. Foreman, Edmonds, WA (US); Jeffrey Stephen Erickson, Lynnwood, WA (US); David Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 982 days.

(21) Appl. No.: 11/965,485

(22) Filed: Dec. 27, 2007

(65) Prior Publication Data

US 2008/0263260 A1    Oct. 23, 2008

Related U.S. Application Data

(60) Provisional application No. 60/912,577, filed on Apr. 18, 2007.

(51) Int. Cl.
G06F 12/00 (2006.01)

(52) U.S. Cl.
USPC ........... 345/564; 345/204; 345/530; 345/533; 345/558

(58) Field of Classification Search
USPC ....................... 345/98, 87; 400/490
See application file for complete search history.

(56) References Cited

U.S. PATENT DOCUMENTS

| | | | |
|---|---|---|---|
| 6,801,178 B2 * | 10/2004 | Nitta et al. | 345/89 |
| 7,667,708 B2 * | 2/2010 | Kamijo et al. | 345/531 |
| 2002/0011979 A1 * | 1/2002 | Nitta et al. | 345/89 |
| 2005/0052394 A1 * | 3/2005 | Waterman | 345/98 |
| 2005/0140659 A1 * | 6/2005 | Hohl et al. | 345/169 |
| 2006/0001671 A1 * | 1/2006 | Kamijo et al. | 345/531 |
| 2006/0192791 A1 * | 8/2006 | Schick et al. | 345/661 |
| 2006/0239746 A1 * | 10/2006 | Grant | 400/490 |
| 2006/0244739 A1 * | 11/2006 | Tsai | 345/204 |
| 2007/0139403 A1 * | 6/2007 | Chung | 345/204 |
| 2007/0159425 A1 * | 7/2007 | Knepper et al. | 345/87 |

* cited by examiner

Primary Examiner — Phi Hoang

(57) ABSTRACT

A display interface buffer includes a general purpose memory to store data capable of being displayed on a panel, a plurality of display drivers to receive data from the general purpose memory, each of the display drivers to drive a different portion of the panel with the data, and processor or a direct memory access controller to access data in the general purpose memory and to provide the data to the display drivers for presentation on the panel.

20 Claims, 5 Drawing Sheets

DISPLAY INTERFACE BUFFER

RELATED APPLICATIONS

This application claims priority from U.S. Provisional Application No. 60/912,577, filed Apr. 18, 2007, which is incorporated herein by reference.

FIELD OF THE INVENTION

The present disclosure relates generally to display devices, and more particularly to a display interface buffer.

BACKGROUND

Many display devices include controllers to present graphics on their display panels. These display devices typically include a dedicated display memory to store data to be presented on the panel according to a fixed mapping with the portion of the panel in which the data is to be displayed. Thus, when prompted by a controller, the dedicated display memory may provide the data in common or segment signals to the display panel for presentation. Dedicated display memories are commonly utilized to present data on display panels. In configurable display systems, dedicated display memories are problematic due to the fixed mapping between the stored data and the display panel and the resulting increased memory size and cost.

DESCRIPTION OF THE DRAWINGS

The invention may be best understood by reading the disclosure with reference to the drawings.

SUMMARY

Figure 1:
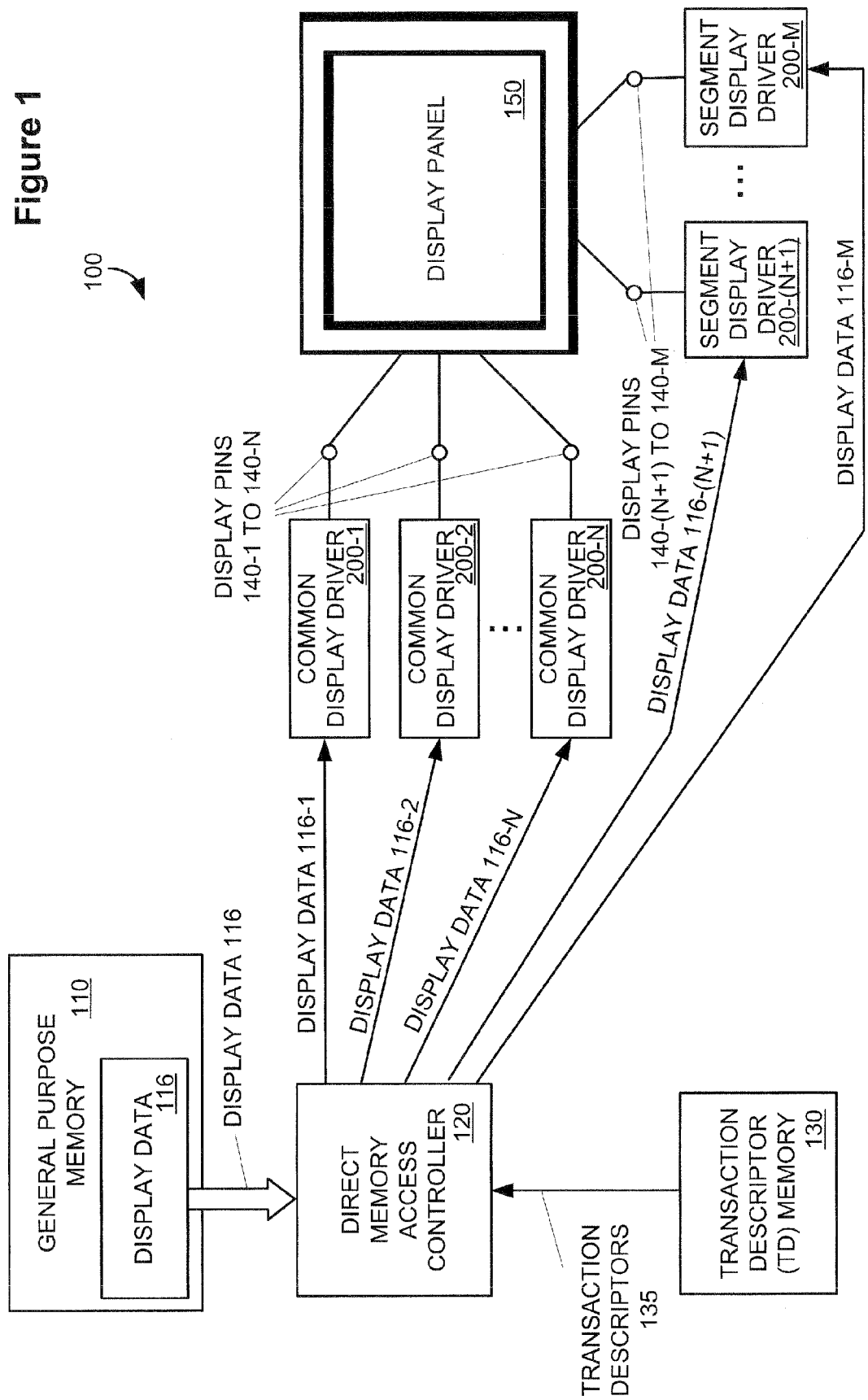
FIG. 1 is a block diagram of a display interface buffering system according to embodiments of the invention.

A device comprising, a general purpose memory to store data capable of being displayed on a panel, a plurality of display drivers to receive data from the general purpose memory, each of the display drivers to drive a different portion of the panel with the data, and a direct memory access controller to access data in the general purpose memory and to provide the data to the display drivers for presentation on the panel.

At least one of the display drivers includes a First-in-First-Out (FIFO) buffer to store the data received from the direct memory access controller, and a drive voltage selector to select at least one of a plurality of reference voltages responsive to the data stored by the FIFO buffer, the selected reference voltage to drive the panel according to at least part of the data stored by the FIFO buffer. The FIFO buffer includes a first memory element to receive data from the direct memory access controller, and a second memory element to receive data from the first memory element and to provide data to the drive voltage selector. The first memory element and the second memory element are flip-flop buffers.

The device including an address decoder to decode an address from the direct memory access controller, the address to indicate which display driver corresponds to the display pin, where the second memory element receives the display data stored by the first memory element responsive to the decoded address.

At least one of the display drivers includes a general purpose interface controller to receive data from the FIFO buffer and provide the data to an input-output pin as general purpose I/O data during a general purpose data mode, where the input-output pin the provide the data to the display drivers for presentation on the panel.

The device including transaction descriptors reflecting a display memory map that direct the direct memory access controller to access display data in the general purpose memory, the transaction descriptors to indicate which of the plurality of display drivers is to receive each bit of the accessed display data for presentation on the panel. The direct memory access controller retrieves display data from the general purpose memory responsive to at least one of the transaction descriptors, and provides at least one of the display drivers the display data and an address that uniquely identifies the display driver to receive the display data.

A method comprising, accessing data in the general purpose memory according to one or more transaction descriptors, identifying one or more display drivers to present the accessed data on a panel by driving a column or segment of the panel, and providing the accessed data to the identified display drivers according to the transaction descriptors.

At least one of the display drivers includes a First-In-First-Out (FIFO) buffer to store the data provided according to the transaction descriptors, and a drive voltage selector to select at least one a plurality of reference voltages responsive to the data stored by the FIFO buffer, the selected reference voltage to drive the panel according to the data stored by the FIFO buffer. The FIFO buffer includes a first memory element to receive data from the direct memory access controller, and a second memory element to receive the display data from the first memory element and to provide the display data to the drive voltage selector.

The method includes receiving general purpose I/O data during a general purpose data mode, and providing the general purpose I/O data to an input-output pin via the display drivers, where the display drivers input-output pin. The method includes enabling a general purpose interface controller in the display drivers to provide general purpose I/O data to the input-output pin during the general purpose data mode, and disabling a buffer in the display drivers from providing data to the panel via the input-output pin during the general purpose data mode. The method includes enabling a buffer in the display drivers to provide data to the panel via the input-output pin during a display driving mode, and disabling a general purpose interface controller in the display drivers from providing general purpose I/O data to the input-output pin during the display driving mode.

A device comprising, structure for accessing data in the general purpose memory according to one or more transaction descriptors, structure for identifying one or more display drivers to present the accessed data on a panel by driving a column or segment of the panel, and structure for providing the accessed data to the identified display drivers according to the transaction descriptors.

At least one of the display drivers includes a First-In-First-Out (FIFO) buffer to store the data received from the direct memory access controller, and a drive voltage selector to select at least one a plurality of bias voltages responsive to the data stored by the FIFO buffer, the selected bias voltage to drive the panel according to the data stored by the FIFO buffer. The FIFO buffer includes a first memory element to receive data from the direct memory access controller, and a second memory element to receive the display data from the first memory element and to provide the display data to the drive voltage selector.

The device includes structure for receiving general purpose I/O data during a general purpose data mode, and structure for providing the general purpose I/O data to an input-output pin via the display drivers, where the display drivers input-output pin. The device includes structure for enabling a general purpose interface controller in the display drivers to provide general purpose I/O data to the input-output pin during the general purpose data mode, and structure for disabling a buffer in the display drivers from providing data to the panel via the input-output pin during the general purpose data mode.

The device includes structure for enabling a buffer in the display drivers to provide data to the panel via the input-output pin during a display driving mode, and structure for disabling a general purpose interface controller in the display drivers from providing general purpose I/O data to the input-output pin during the display driving mode.

DETAILED DESCRIPTION

FIG. 1 is a block diagram of a display interface buffering system 100 according to embodiments of the invention. Referring to FIG. 1, the display interface buffering system 100 includes a general purpose memory 110 to store display data 116 that is capable of being presented on a display panel 150. The general purpose memory 110 may store data other than the display data 116, i.e., the general purpose memory 110 may not be dedicated solely for storing display data. The display data 116 may be stored anywhere in the general purpose memory 110, for example, in a contiguous memory block, or in multiple non-contiguous memory locations.

The display interface buffering system 100 includes a direct memory access controller 120 to receive display data 116 from the general purpose memory 110 and provide the display data 116 to at least one of a plurality of display drivers 200-1 to 200-N and 200-(N+1) to 200-M. For example, display driver 200-1 may receive display data 116-1 from the direct memory access controller 120, display driver 200-N may receive display data 116-N, and display driver 200-M may receive display data 116-M. In some embodiments, the display drivers 200-1 to 200-N may be common drivers, while display drivers 200-(N+1) to 200-M may be segment drivers of a display panel 150.

The direct memory access controller 120 may transfer the display data 116 to the appropriate display driver 200-1 to 200-N and 200-(N+1) to 200-M in a direct memory access (DMA) burst that include one or more bytes of data. In systems operating at a high frequency, direct memory access controller 120 may transfer the display data 116 a few bits at a time in the background so as to not disrupt normal operations of the display interface buffering system 100.

The display interface buffering system 100 includes a transaction descriptor (TD) memory 130, coupled to the direct memory access controller 120, to store transaction descriptors 135. The transaction descriptors 135 can indicate a relationship between the display data 116 in the general purpose memory 110 and the portion of the display panel 150 that the display data 116 is to be presented. For instance, a transaction descriptor 135 may identify a location in the general purpose memory 110 that stores the display data 116 and a corresponding display driver 200-1 to 200-N and 200-(N+1) to 200-M to receive and present the display data 116 on the display panel 150.

When provided to the direct memory access controller 120, the transaction descriptors 135 can identify one or more display drivers 200-1 to 200-N and 200-(N+1) to 200-M to receive the display data 116 stored in the general purpose memory 110. In some embodiments, the transaction descriptors 135 may prompt the direct memory access controller 120 to retrieve the display data 116 from the general purpose memory 110.

The use of transaction descriptors 135 to define a display memory map allows the display interface buffering system 100 the flexibility to locate display data 116 anywhere in a general purpose memory 110 as opposed to requiring a dedicated display memory with fixed mapping to a display panel, and still be able to accurately provide the display data 116 to the appropriate display driver 200-1 to 200-N and 200-(N+1) to 200-M. It should be noted that the display data 116 does not need to comprise a single contiguous block of memory within memory 110—the display memory 116 could be comprised of numerous small fragments distributed across memory 110, interleaved with other general data stored in the memory. By locating the display data 116 in the general purpose memory 110, the display interface buffering system 100 can reduce overall system cost and size, while providing increased system configurability and versatility.

The display drivers 200-1 to 200-N and 200-(N+1) to 200-M may drive corresponding display pins 140-1 to 140-N 140-(N+1) to 140-M and the display panel 150 according to the display data 116-1 to 116-N and 116-(N+1) to 116-M, respectively, from the direct memory access controller 120. In some embodiments, the display drivers 200-1 to 200-N and 200-(N+1) to 200-M may be configurable to generate common drive signals that activate rows of the display panel 150 or segment drive signals that activate columns of the display panel 150. For instance, each of the display drivers 200-1 to 200-N may be common drivers to drive rows of the display panel 150 with corresponding display data 116-1 to 116-N received from the direct memory access controller 120. Each of the display drivers 200-(N+1) to 200-M may be segment drivers to drive columns of the display panel 150 with corresponding display data 116-(N+1) to 116-M received from the direct memory access controller 120. Embodiments of the display drivers 200-1 to 200-N and 200-(N+1) to 200-M will be described below in greater detail.

Although FIG. 1 shows and describes the display interface buffering system 100 including a direct memory access controller 120 that provides display data 116 from the display memory 115 to the display drivers 200 for presentation on the display panel 150, in some embodiments, a central processor (not shown) for the display interface buffering system 100 may be used in lieu of or in conjunction with the direct memory access controller 120 to transfer the display data 116 to the display panel 150.

Figure 2A:
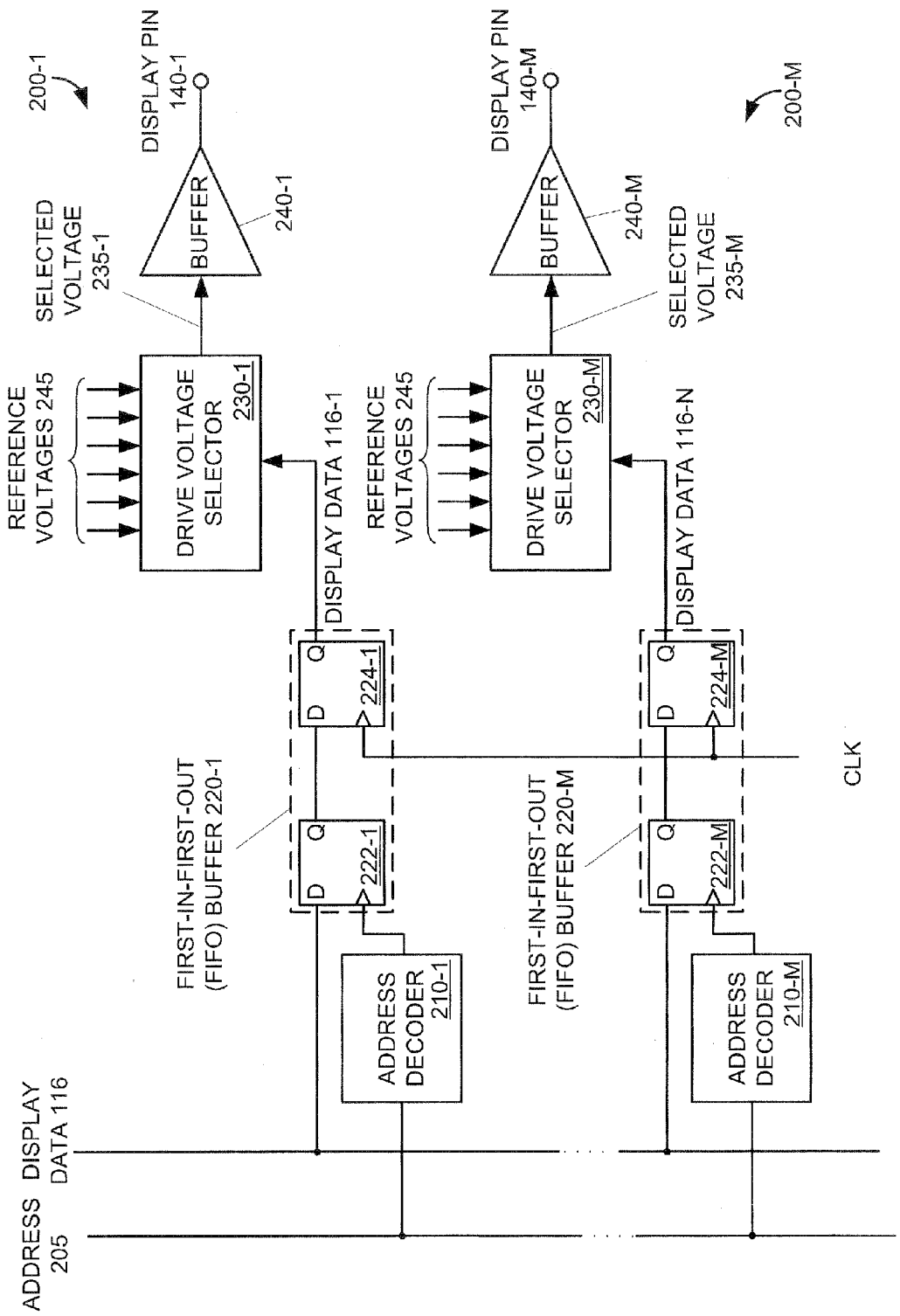
FIG. 2A is a block diagram illustrating embodiments of the display drivers shown in FIG. 1.

FIG. 2A is a block diagram illustrating embodiments of the display drivers 200-1 to 200-M shown in FIG. 1. Referring to FIG. 2A, the display drivers 200-1 to 200-M may include First-In-First-Out (FIFO) buffers 220-1 to 220-M, respectively, to store one or more bits of the display data 116-1 to 116-M prior to their presentation of the display panel 150. The FIFO buffers 220-1 to 220-M may provide the display data 116-1 to 116-M to respective drive voltage selectors 230-1 to 230-M, where the drive voltage selectors 230-1 to 230-M may select at least one bias voltage 245 that will drive the display panel 150 according to the respective display data 116-1 to 116-M.

The FIFO buffers 220-1 to 220-M may include a pair of cascaded memory elements such as D flip-flops 222-1 or 222-M and 224-1 or 224-M, respectively. A first memory element 222-1 or 222-M receives display data 116-1 to 116-M from the direct memory access controller 120, which in some embodiments may be latched according to an address signal 205 provided by the direct memory access controller 120. The display drivers 200-1 to 200-M may include address decoders 210-1 to 210-M to decode address signals 205 received from the direct memory access controller 120 and prompt the first memory elements 222-1 or 222-M to latch display data 116-1 to 116-M received from the direct memory access controller 120. This address signal 205 may identify one or more of the display drivers 200-1 to 200-M that are to present the display data 116-1 to 116-M on the display panel 150. For instance, when the direct memory access controller 120 provides display data 116-1 and an address signal 205 identifying display driver 200-1 as the intended recipient of the display data 116-1, the address decoder 210-1 may decode the address signal 205 and generate a latching signal that prompts the first memory element 222-1 to latch display data 116-1.

A second memory element 224-1 to 224-M may receive the display data 116-1 to 116-M from corresponding first memory elements 222-1 to 222-M, and latch the display data 116-1 to 116-M responsive to an internal clock signal CLK. The second memory element 224-1 to 224-M may provide the latched display data 116-1 to 116-M to drive voltage selectors 230-1 to 230-M, respectively, responsive to the internal clock signal CLK.

The drive voltage selectors 230-1 to 230-M may select one or more of the reference voltages 245 according to the display data 116-1 to 116-M from the FIFO buffers 220-1 to 220-M, respectively. The drive voltage selectors 230-1 to 230-M may provide the selected reference voltage 235-1 to 235-M to buffers 240-1 to 240-M, respectively, for buffering prior to output to respective display pins 140-1 to 140-M. In some embodiments, the drive voltage selector 230-1 to 230-M may provide the selected voltage directly to the respective display pins 140-1 to 140-M. For example, when drive voltage selectors 230-1 to 230-M include low impedance switches the selected reference voltage(s) 245 may be directly routed to the display pins 140-1 to 140-M without intermediate drive buffering.

Thus, while the memory elements 222-1 to 222-M are controlling the voltages driven to the display on display pins 140-1 to 140-M, the next state control data can be loaded one bit at a time over a period of time. All these bits may then be loaded simultaneously into the second memory elements 224-1 to 224-M on the active edge of the internal clock signal CLK.

In some embodiments, the address signal 205 may correspond to multiple display drivers 200-1 to 200-M. For instance, when the direct memory access controller 120 provides a byte of display data 116 on a data bus to the display drivers 200-1 to 200-M, the address signal 205 may identify 8 display drivers 200 to each extract a bit from the byte of display data 116. In some embodiments, the address signal 205 may indicate which bit the display driver 200 is to retrieve from the byte of display data 116, or the bit of display data 116 may be predetermined in the display driver 200. By loading multiple display drivers 200 with display data 116 substantially simultaneously, the direct memory access controller 120 can more efficiently utilize and manage the address and data bus.

Figure 2B:
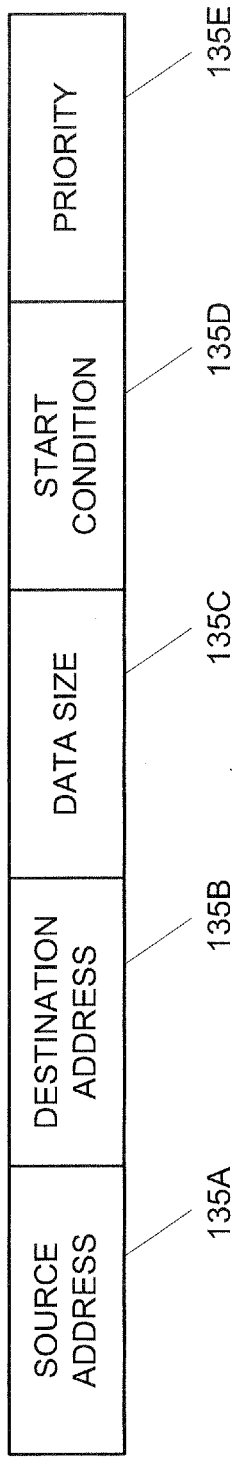
FIG. 2B is a timing diagram illustrating operational embodiments of the display drivers shown in FIG. 1.

FIG. 2B is a diagram illustrating embodiments of the transaction descriptors 135 shown in FIG. 1. Referring to FIG. 2B, a transaction descriptor 135 includes multiple fields that convey information to the direct memory access controller 120 about locating and transferring display data 116 from the general purpose memory 110 to one or more of the display drivers 200-1 to 200-M.

The transaction descriptor 135 can include a source address field 135A that indicates a location in the general purpose memory 110 storing display data 116 for at least one of the display drivers 200-1 to 200-M. The source address field 135A may be a memory address, or any other suitable indicator of the location of the display data 116.

The transaction descriptor 135 can include a destination address field 135B that identifies at least one of the display drivers 200-1 to 200-M to receive the display data 116 located by the source address. The destination address field 135B may include address signal 205 or indicate to the direct memory access controller 120 which address signal 205 to provide on an address bus when the display data 116 is provided on a data bus to the display drivers 200-1 to 200-M. In some embodiments, the destination address field 135B may identify multiple display drivers 200-1 to 200-M, for example, the destination address field 135B may identify a group of 8 display drivers 200 and the source address 135A may identify a corresponding byte of display data 116 to be provided to the group of display drivers.

The transaction descriptor 135 can include a data size field 135C that indicates the size of the display data 116 stored in the general purpose memory 110 and to be provided to at least one of the display drivers 200-1 to 200-M. For instance, when the data size field 135C indicates 1 byte of data is stored at the memory location indicated by the source address field 135A, the direct memory access controller 120 can request a byte of display data 116 from the general purpose memory 110.

The transaction descriptor 135 can include a start condition field 135D that indicates when to retrieve and transfer the display data 116 stored in the general purpose memory 110 to the display drivers 200-1 to 200-M identified by the destination address field 135B. The start condition field 135D may indicate the direct memory access controller 120 is to initiate the direct memory access operations outlined by the transaction descriptor 135 responsive to a clock signal CLK. In some embodiments, another controller or circuit (not shown), possibly external to the display interface buffering system 100, can set a flag or provide an interrupt that prompts the direct memory access controller 120 to initiate the direct memory access operations of the transaction descriptor 135.

The transaction descriptor 135 can include a priority field 135E that indicates the priority of the direct memory access operation detailed by the transaction descriptor 135E. The direct memory access controller 120 can utilize the priority field 135E to determine when to execute the transaction descriptor 135 and utilize the address and data buses. For instance, the priority field 135E of the transaction descriptor 135 can indicate the corresponding direct memory access operation has a low priority, and thus be entitled to utilize the data bus and address bus less than a high priority transaction descriptor 135. Although FIG. 2B shows and describes 5 fields within transaction descriptor 135, in some embodiments, the transaction descriptor 135 can include additional fields, or merge multiple fields into a single field.

Figure 2C:
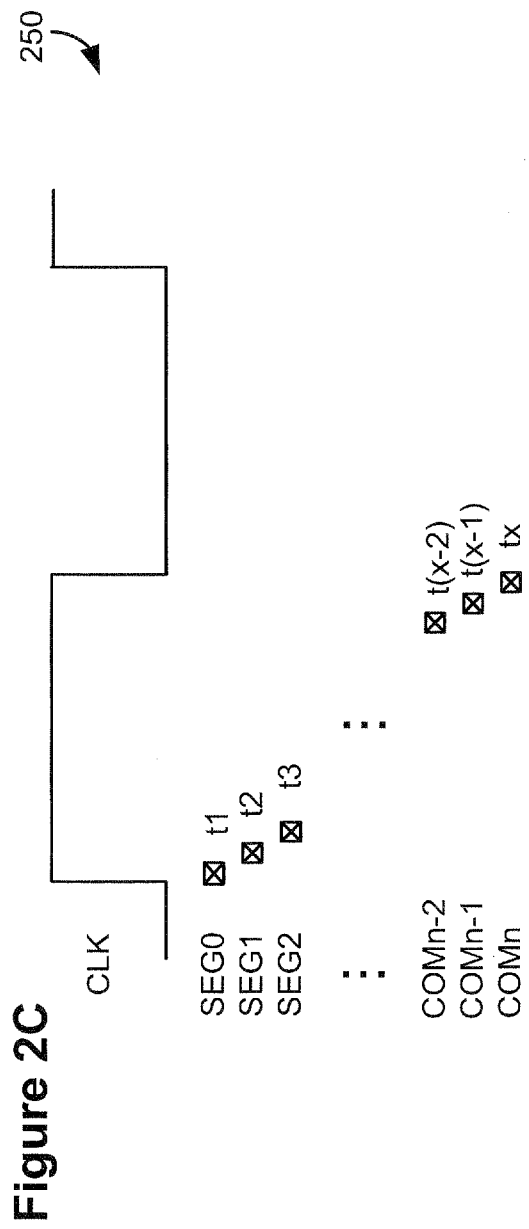
FIG. 2C is a diagram illustrating embodiments of the transaction descriptors shown in FIG. 1.

FIG. 2C is a timing diagram 250 illustrating operational embodiments of the display drivers 200-1 to 200-M shown in FIG. 1. Referring to FIG. 2C, the timing diagram 250 shows a clock signal CLK, which can trigger the execution of one or more transaction descriptors 135, for example, when a start condition field 135D indicates the clock signal CLK is to initiate the execution of the corresponding transaction descriptors 135.

After the rising (or falling) edge of the clock signal CLK, the direct memory access controller 120 can begin to retrieve display data 116 from the general purpose memory 110 according to the source address field 135A in the transaction descriptor 135 and provide the display data 116 to one or more of the display drivers 200-1 to 200-M identified in the destination address field 135B of the transaction descriptor 135. Since the display drivers 200-1 to 200-M can share a common data bus and/or address bus, which provide the address signal 205 and display data 116 to the display drivers 200-1 to 200-M, operations to particular display drivers 200-1 to 200-M may be staggered until there is another rising or falling edge of the clock signal CLK. Thus, at the end of the period of the clock signal CLK, the display drivers 200-1 to 200-M have locked-in the display data 116 from the direct memory access controller 120, which is subsequently used to select a reference voltage 235-1 to 235-M for output to each corresponding display pin 140-1 to 140-M, such as common COM and segment SEG pins.

The timing diagram 250 shows multiple display data 116 latching events by the display drivers 200-1 to 200-M, for example, at staggered time periods t0-tn. These latching events may be performed by the FIFO buffers 220-1 to 220-M in the corresponding display drivers 200-1 to 200-M. By staggering the latching of display data 116, the direct memory access controller 120 can distribute the utilization of the address and/or data buses over the period of the clock signal CLK.

Figure 3:
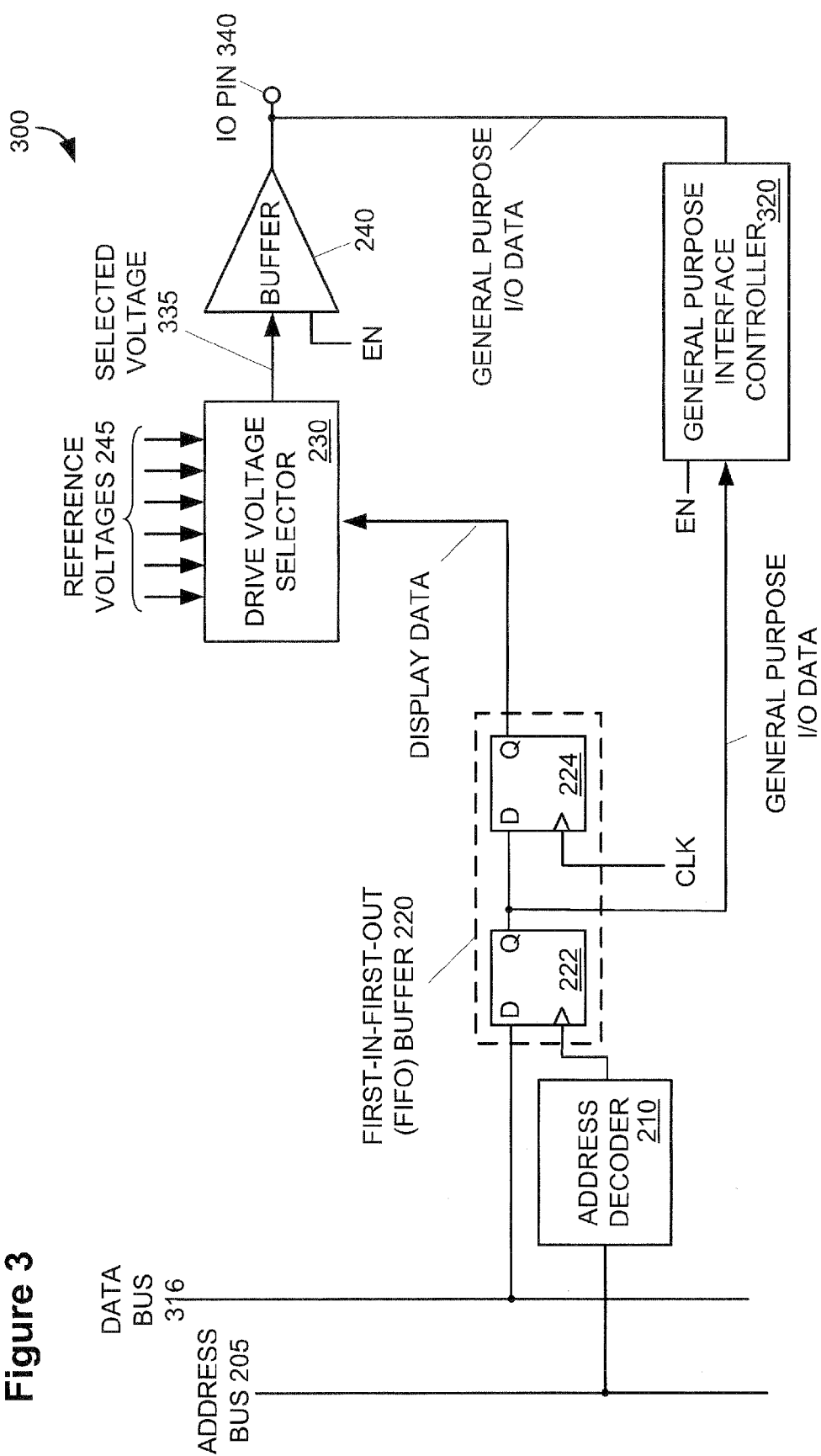
FIG. 3 is a block diagram illustrating other embodiments of a display driver.

FIG. 3 is a block diagram illustrating embodiments of a display driver 300. Referring to FIG. 3, the display driver 300 is similar to display drivers 200-1 to 200-N and 200-(N+1) to 200-M shown and described above in FIGS. 1 and 2 with the following differences. The display driver 300 may operate in multiple modes, including a display driving mode as shown and described above FIGS. 1 and 2, and a general purpose I/O mode.

General Purpose Mode

The general purpose I/O mode allows the display driver 300 to leverage display driving architecture of the display interface buffering system 100 to output data from a data bus 316 at a common Input-Output (IO) pin 340, as either display data for the LCD panel 150 or general purpose I/O data. The display driver 300 may receive general purpose I/O data through the data bus 316 from a central processor (not shown) or the direct memory access controller 120 and then output the general purpose I/O data to the IO pin 340 via a general purpose interface controller 320. The general purpose I/O data may be provided to a First-In-First-Out (FIFO) buffer 220, which buffers the general purpose I/O data and subsequently provides the general purpose I/O data to the general purpose interface controller 320. The FIFO buffer 220 includes a memory element 222 which receives and latches the data 316 according to an address 205 decoded by an address decoder 210. The FIFO buffer 220, i.e., the memory element 222, may provide the general purpose I/O data to the general purpose interface controller 320. When enabled, the general purpose interface controller 320 provides the general purpose I/O data to the IO pin 340 for output from the display driver 300. In some embodiments, during the general purpose I/O mode, the general purpose interface controller 320 may be enabled with an enable signal EN, and the buffer 240 may be disabled with the enable signal EN.

Display Driving Mode

In the display driving mode, the display driver 300 operates similarly to display drivers 200-1 to 200-N and 200-(N+1) to 200-M with FIFO buffer 220 receiving display data from data bus 316 and providing the display data to the FIFO buffer 220. The FIFO buffer 220 may receive the display data at the first memory element 222 and provide the display data to a second memory element 224 on an active edge of the internal clock signal CLK. The FIFO buffer 220, via the second memory element 224 may provide the display data to the drive voltage selector 230, thus driving 10 pin 340 through drive voltage selector 230 and buffer 240 when enabled responsive to the enable signal EN. During the display driving mode, the general purpose interface controller 320 may be disabled, e.g., according to the enable signal EN In some embodiments, the display interface buffering system 100 may substitute one or more of the display drivers 300 for the display drivers 200.

Figure 4:
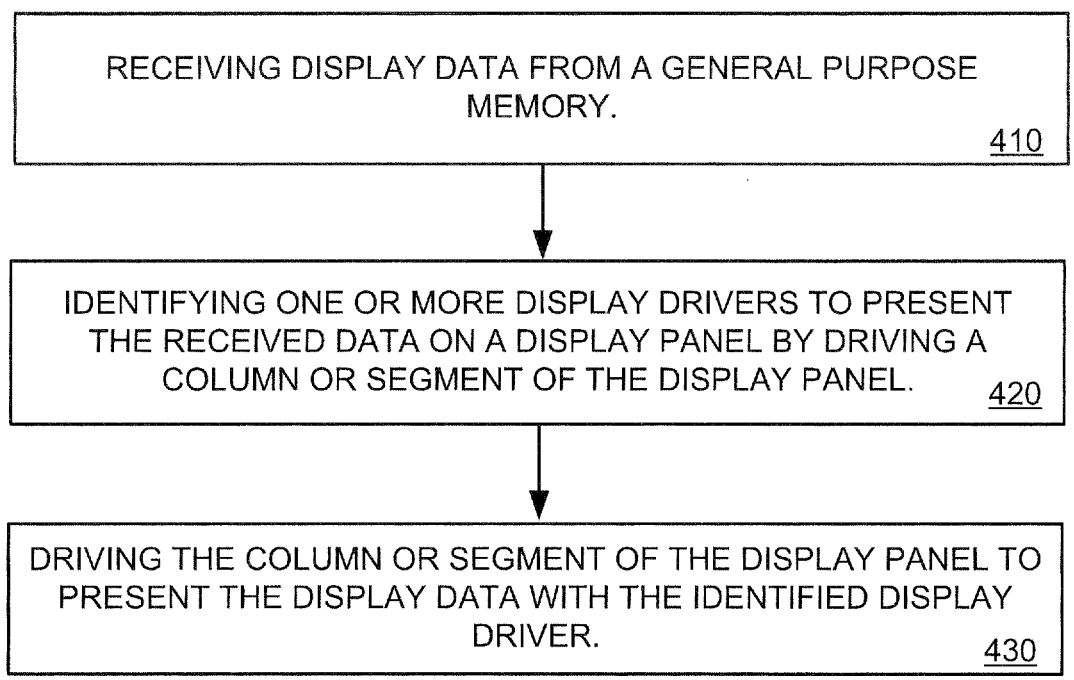
FIG. 4 is an example flowchart of the display interface buffering system shown in FIG. 1.

FIG. 4 is an example flowchart of the display interface buffering system 100 shown in FIG. 1. Referring to FIG. 4, in a block 410, the display interface buffering system 100 receives display data 116 from a general purpose memory 110. This reception of display data may be performed in direct memory access (DMA) operations or through traditional memory accesses via a central processor (not shown).

In a block 420, the display interface buffering system 100 to identify one or more display drivers to present the received data on a display panel by driving a column or segment of the display panel. In some embodiments, the display interface buffering system 100 determines a portion of a display panel 150 to present the display data 116 according to a transaction descriptor memory 130 described by transaction descriptors 135. The portion of the display panel 150 that corresponds to the display data 116 may be determined according to one or more transaction descriptors stored in the transaction descriptor memory 130. The transaction descriptors may identify at least one display driver 200-1 to 200-N and 200-(N+1) to 200-M that corresponds to the portion of the display panel 150 to present each item of display data 116.

In a block 430, the display interface buffering system 100 drives the portion of the display panel 150 to present the display data 116 with the identified display driver 200. The display driver 200 may include a FIFO buffer 220 to receive and buffer the display data 116 received from the direct memory access controller 120 and a drive voltage selector 230 to drive a display pin 140 coupled to the display panel 150 according to the display data 116 buffered by the FIFO buffer 220.

One of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A device, comprising:
   a general purpose memory to store data capable of being displayed on a panel;

a plurality of display drivers configured to receive data from the general purpose memory, wherein each of the display drivers is configured to drive a different portion of the panel with the data;

a direct memory access controller to access data in the general purpose memory and to provide the data to the display drivers for presentation on the panel; and transaction descriptors reflecting a display memory map, wherein each of the transaction descriptors is configured to direct the direct memory access controller to access the data in the general purpose memory;

associate at least one of a plurality of contiguous destination addresses, each of the contiguous destination addresses identifying at least one of the plurality of display drivers, with one of a plurality of noncontiguous source addresses each indicating a location in the general purpose memory; and identify a data size of the data to be accessed by the direct memory access controller.

2. The device of claim 1, wherein at least one of the display drivers comprises:

a First-In-First-Out (FIFO) buffer configured to store the data received from the direct memory access controller; and a drive voltage selector configured to select at least one of a plurality of reference voltages responsive to the data stored by the FIFO buffer, the selected reference voltage configured to drive the panel according to at least part of the data stored by the FIFO buffer.

3. The device of claim 2 where the FIFO buffer comprises:

a first memory element configured to receive data from the direct memory access controller; and a second memory element configured to receive data from the first memory element and to provide data to the drive voltage selector.

4. The device of claim 3, wherein the first memory element and the second memory element are flip-flop buffers.

5. The device of claim 3, comprising an address decoder to decode the destination address from the direct memory access controller, wherein the destination address indicates a display driver corresponding to the display pin, wherein the second memory element receives the display data stored by the first memory element responsive to the decoded address.

6. The device of claim 2, wherein at least one of the display drivers includes a general purpose interface controller configured to receive data from the FIFO buffer and provide the data to an input-output pin as general purpose I/O data during a general purpose data mode, and wherein the input-output pin is configured to provide the data to the display drivers for presentation on the panel.

7. The device of claim 1, wherein the transaction descriptors are further configured to indicate which of the plurality of display drivers is to receive each bit of the accessed display data for presentation on the panel.

8. The device of claim 1, wherein the direct memory access controller is configured to retrieve display data from the general purpose memory responsive to at least one of the transaction descriptors, and is further configured to provide at least one of the display drivers the display data and an address that uniquely identifies the display driver to receive the display data.

9. A method comprising:

in one or more transaction descriptors, associating at least one of a plurality of contiguous destination addresses, each of the contiguous destination addresses identifying at least one of a plurality of display drivers, with one of a plurality of noncontiguous source addresses each indicating a location in a general purpose memory and identifying a data size of the data to be accessed by the direct memory access controller;

accessing the data in the general purpose memory according to the one or more transaction descriptors;

identifying one or more of the plurality of display drivers to present the accessed data on a panel by driving a column or segment of the panel; and providing the accessed data to the identified one or more display drivers according to the transaction descriptors.

10. The method of claim 9 where at least one of the display drivers comprises:

a First-In-First-Out (FIFO) buffer configured to store the data provided according to the transaction descriptors; and a drive voltage selector configured to select at least one a plurality of reference voltages responsive to the data stored by the FIFO buffer, wherein the selected reference voltage is configured to drive the panel according to the data stored by the FIFO buffer.

11. The method of claim 10, wherein the FIFO buffer comprises:

a first memory element configured to receive data from the direct memory access controller; and a second memory element configured to receive the display data from the first memory element and to provide the display data to the drive voltage selector.

12. The method of claim 10, further comprising:

receiving general purpose I/O data during a general purpose data mode;

and providing the general purpose I/O data to an input-output pin via the display drivers.

13. The method of claim 12, comprising:

enabling a general purpose interface controller in the display drivers to provide general purpose I/O data to the input-output pin during the general purpose data mode; and disabling a buffer in the display drivers from providing data to the panel via the input-output pin during the general purpose data mode.

14. The method of claim 12, comprising:

enabling a buffer in the display drivers to provide data to the panel via the input-output pin during a display driving mode; and disabling a general purpose interface controller in the display drivers from providing general purpose I/O data to the input-output pin during the display driving mode.

15. A method comprising:

receiving one or more transaction descriptors each associating at least one of a plurality of contiguous destination addresses and identifying a data size of data to be accessed, each of the contiguous destination addresses identifying at least one of a plurality of display drivers, with one of a plurality of noncontiguous source addresses each indicating a location in a general purpose memory;

accessing the data in the general purpose memory according to the one or more received transaction descriptors;

according to the one or more received transaction descriptors, identifying at least one of the plurality of display drivers to present the accessed data on a panel by driving a column or segment of the panel; and providing the accessed data to the at least one identified display driver according to the transaction descriptors.

16. The method of claim 15 where at least one of the display drivers comprises:

storing, in a First-In-First-Out (FIFO) buffer, the data received from the direct memory access controller; and selecting at least one a plurality of bias voltages responsive to the data stored by the FIFO buffer, the selected bias voltage to drive the panel according to the data stored by the FIFO buffer.

17. The method of claim 16, further comprising:

receiving, in a first memory element, data from the direct memory access controller;

receiving, in a second memory element, the display data from the first memory element; and providing the display data to the drive voltage selector.

18. The method of claim 16, further comprising:

receiving general purpose I/O data during a general purpose data mode;

and providing the general purpose I/O data to an input-output pin via the display drivers.

19. The method of claim 18, comprising:

enabling a general purpose interface controller in the display drivers to provide general purpose I/O data to the input-output pin during the general purpose data mode; and disabling a buffer in the display drivers from providing data to the panel via the input-output pin during the general purpose data mode.

20. The method of claim 18, comprising:

enabling a buffer in the display drivers to provide data to the panel via the input-output pin during a display driving mode; and disabling a general purpose interface controller in the display drivers from providing general purpose I/O data to the input-output pin during the display driving mode.

* * * * *